(12) United States Patent
Ishii et al.

(10) Patent No.: US 10,033,275 B2
(45) Date of Patent: Jul. 24, 2018

(54) DC-DC CONVERTER WITH A SWITCHING TRANSISTOR ARRANGED IN AN AREA WHERE AN INDUCTOR OVERLAPS A SUBSTRATE

(71) Applicant: Panasonic Intellectual Property Management Co., Ltd., Osaka (JP)

(72) Inventors: Takuya Ishii, Osaka (JP); Atsushi Kitagawa, Kyoto (JP); Tadata Hatanaka, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/013,426

(22) Filed: Feb. 2, 2016

(65) Prior Publication Data

US 2016/0164417 A1    Jun. 9, 2016

Related U.S. Application Data

(63) Continuation of application No. PCT/JP2014/001100, filed on Feb. 28, 2014.

(30) Foreign Application Priority Data

Aug. 7, 2013  (JP) .................................. 2013-164040

(51) Int. Cl.
*H02M 3/155*  (2006.01)
*H02M 3/158*  (2006.01)
(Continued)

(52) U.S. Cl.
CPC ............ *H02M 3/158* (2013.01); *H01L 24/49* (2013.01); *H01L 25/00* (2013.01); *H01L 25/04* (2013.01);
(Continued)

(58) Field of Classification Search
CPC ...... H05K 1/165; H05K 1/0233; H02M 3/155
See application file for complete search history.

(56) References Cited

U.S. PATENT DOCUMENTS 8,704,108 B2 * 4/2014 Schaible ................. H01F 17/04
174/521
2004/0140877 A1 7/2004 Nakao et al.
(Continued)

FOREIGN PATENT DOCUMENTS

JP        H10-22137 A      1/1998
JP        2004-063676 A    2/2004
(Continued)

OTHER PUBLICATIONS

International Search Report dated May 27, 2015, issued in corresponding International Application No. PCT/JP2014/001100. (w/ partial English translation).

*Primary Examiner* — Harry Behm
(74) *Attorney, Agent, or Firm* — McDermott Will & Emery LLP

(57) ABSTRACT

A DC-DC converter module includes a module substrate on which switching transistors and a controller IC chip are mounted, stud terminals mounted on a surface of the module substrate, and an inductor attached to the stud terminals such that the inductor faces the module substrate. In a plan view, the switching transistors are arranged within an area where the inductor overlaps the module substrate, whereas at least a portion of the controller IC chip is arranged outside the area.

6 Claims, 4 Drawing Sheets

(51) Int. Cl.
*H01L 25/00* (2006.01)
*H01L 25/04* (2014.01)
*H01L 25/18* (2006.01)
*H01L 23/00* (2006.01)
*H02M 7/00* (2006.01)

(52) U.S. Cl.
CPC ............ *H01L 25/18* (2013.01); *H02M 3/155* (2013.01); *H01L 24/48* (2013.01); *H01L 2224/48091* (2013.01); *H01L 2224/48137* (2013.01); *H01L 2224/48227* (2013.01); *H01L 2224/48247* (2013.01); *H01L 2224/49113* (2013.01); *H01L 2224/49431* (2013.01); *H01L 2924/00014* (2013.01); *H01L 2924/13091* (2013.01); *H01L 2924/19041* (2013.01); *H01L 2924/19042* (2013.01); *H01L 2924/19104* (2013.01); *H01L 2924/19105* (2013.01); *H02M 7/003* (2013.01)

(56) References Cited

U.S. PATENT DOCUMENTS

2007/0246772 A1* 10/2007 Lee .................. H01L 23/49562
257/341
2008/0001279 A1* 1/2008 Elbanhawy ............ H01L 25/16
257/691
2009/0103272 A1 4/2009 Watanabe
2009/0108821 A1* 4/2009 Standing ............ H02M 3/1584
323/272
2009/0256245 A1* 10/2009 Liu ................... H01L 23/49548
257/666
2010/0061071 A1 3/2010 Watanabe
2011/0169144 A1* 7/2011 Moreno ........... H01L 23/49503
257/666
2011/0228507 A1 9/2011 Yin et al.
2012/0063038 A1* 3/2012 Yin ..................... H05K 9/0007
361/18
2013/0049730 A1 2/2013 Kato
2014/0062446 A1* 3/2014 Ikriannikov ............ H02M 1/14
323/304

FOREIGN PATENT DOCUMENTS

| JP | 2010-045393 A | 2/2010 |
| JP | 2011-193000 A | 9/2011 |
| JP | 2013-046509 A | 3/2013 |
| JP | 2013-141035 A | 7/2013 |
| JP | 2014-072350 A | 4/2014 |
| WO | 2007/049788 A1 | 5/2007 |

* cited by examiner

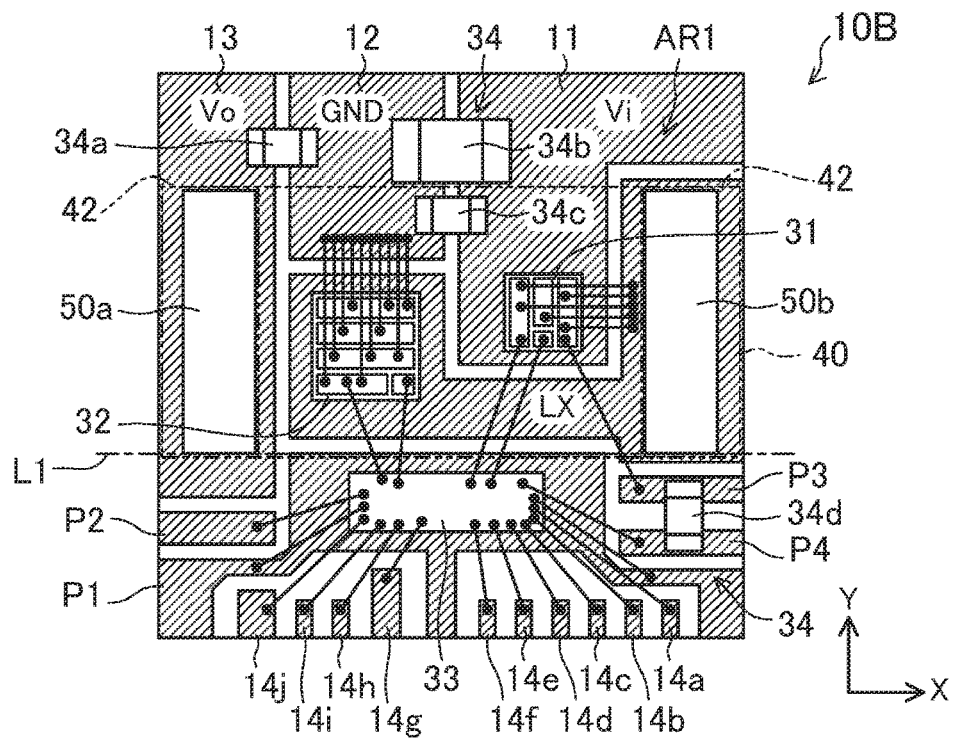
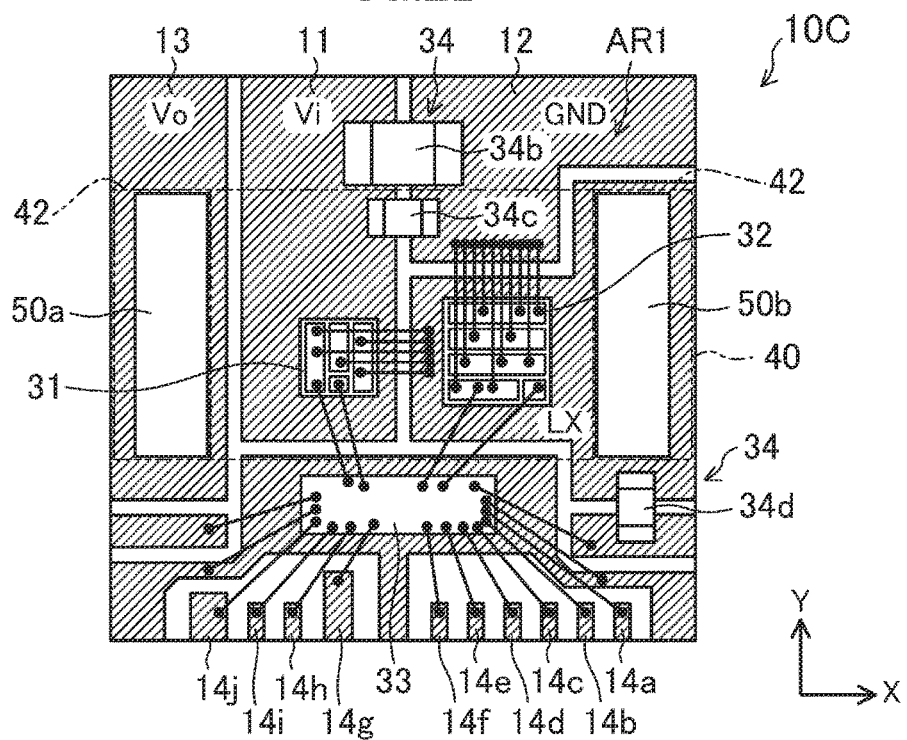

DC-DC CONVERTER WITH A SWITCHING TRANSISTOR ARRANGED IN AN AREA WHERE AN INDUCTOR OVERLAPS A SUBSTRATE

CROSS-REFERENCE TO RELATED APPLICATION

This is a continuation of International Application No. PCT/JP2014/001100 filed on Feb. 28, 2014, which claims priority to Japanese Patent Application No. 2013-164040 filed on Aug. 7, 2013. The entire disclosures of these applications are incorporated by reference herein.

BACKGROUND

The present disclosure relates to a DC-DC converter module in which a switching DC-DC converter is installed in a single package.

DC-DC converter modules each included in a single package are capable of converting power with high efficiency and being mounted in various types of devices because of its small size. Therefore, in recent years, the DC-DC converter modules have been used as a point of load (POL) power supply, which is arranged very close to a load circuit, in various electronic devices such as notebook computers.

FIGS. 4A and 4B show the configuration of a DC-DC converter module disclosed in Japanese Unexamined Patent Publication No. 2004-63676. FIG. 4A is an exploded perspective view and FIG. 4B shows the assembled and finished module. In FIGS. 4A and 4B, a micro converter (a DC-DC converter) 60 is comprised of a module substrate 61, a semiconductor integrated circuit (IC) 62, a micro inductor 70, and stud terminals 80. On the upper surface of the module substrate 61, surface-mounted electrodes and a circuit wiring pattern are formed, for example. On a side end surface of the module substrate 61, surface-mounted electrode terminals (side surface terminals) 63 are formed. The IC 62, the stud terminals 80, and a small number of CR components 64 are mounted on the upper mounting surface of the module substrate 61. The IC 62 includes switching transistors and a control circuit that are integrated therein, and is surface-mounted on the module substrate 61. The micro inductor 70 is a magnetic core inductor configured as a chip component, and mounted to be supported on the stud terminals 80 that are arranged in the four corner portions of the module substrate 61. As can be seen from the foregoing, the micro inductor 70 is placed over the module substrate 61 such that the micro inductor 70 overlaps the IC 62 in the vertical direction, which reduces the mounting area.

Japanese Unexamined Patent Publication No. 2004-63676 does not disclose the inside structure of the micro inductor 70. On the other hand, Japanese Patent Publication No. H10-22137 discloses a typical structure of a thin (planar) inductor of this type.

FIG. 5 is a perspective view showing the inductor disclosed in Japanese Patent Publication No. H10-22137.

In FIG. 5, the inductor 90 has a structure in which a drum-shaped core 91 is provided with a wound wire 92 and an end of the wound wire 92 is wound around an electrode portion 93. As can be understood from this structure, when the inductor 90 is operating, the magnetic flux passes through the drum-shaped core 91, which allows leakage flux to occur above and under the inductor 90.

SUMMARY

In the micro converter 60 disclosed in Japanese Unexamined Patent Publication No. 2004-63676, the IC 62 including the integrated circuits such as the control circuit which operates using a small amount of power is arranged immediately under the micro inductor 70 (the inductor). Therefore, the IC 62 (for example, the control circuit) is exposed to the leakage flux from the inductor that operates by receiving high-frequency square waves. Consequently, the IC 62 (for example, the control circuit) may be hindered from stably operating.

In addition, if a switching transistors (MOS transistors Q1 and Q2 in Japanese Unexamined Patent Publication No. 2004-63676) are arranged immediately under the inductor (the micro inductor 70 in Japanese Unexamined Patent Publication No. 2004-63676), both transistors are sandwiched between the terminals of the inductor. In this case, if both transistors are mounted exactly according to a circuit configuration, the DC-DC converter module has a terminal arrangement in which the input power supply terminal, the output terminal, the ground terminal are arranged in this order. This arrangement adversely makes it difficult to form a wiring pattern for an input capacitor and an output capacitor that are provided outside the DC-DC converter (the micro converter).

In view of the foregoing, it is therefore an object of the present disclosure to provide a DC-DC converter module which is reduced in size and ensures stable operation of a control circuit.

An aspect of the present disclosure provides a DC-DC converter module in which a DC-DC converter having a switching transistor and a control circuit controlling the switching transistor is provided. The DC-DC converter module comprises: a substrate on which the switching transistor and the control circuit are mounted; a projection terminal projecting from the substrate; and an inductor attached to the projection terminal so as to face the substrate, and electrically connected to the substrate through the projection terminal. In a plan view, the switching transistor is arranged in an area where the inductor overlaps the substrate, whereas at least a portion of the control circuit is arranged outside the area.

According to this aspect, in a plan view, the switching transistor is arranged within the area where the inductor overlaps the substrate, whereas at least a portion of the control circuit is outside the area. With this configuration, influence that leakage flux from the inductor exerts on the control circuit operating in response to a small signal is reduced, which allows for ensuring stable operation of the DC-DC converter module (the DC-DC converter).

The present disclosure allows for reducing influence which leakage flux from an inductor exerts on a control circuit mounted on a substrate of a DC-DC converter module. This ensures stable operation of the DC-DC converter module.

BRIEF DESCRIPTION OF THE DRAWINGS

FIG. 2A is a conceptual diagram showing an example of a wiring pattern of the DC-DC converter module according to an embodiment, and FIG. 2B shows a comparative example of a wiring pattern for explaining the advantageous features of the present disclosure.

DETAILED DESCRIPTION

A DC-DC converter module of the present disclosure will be described below with reference to the drawings.

Figure 1:
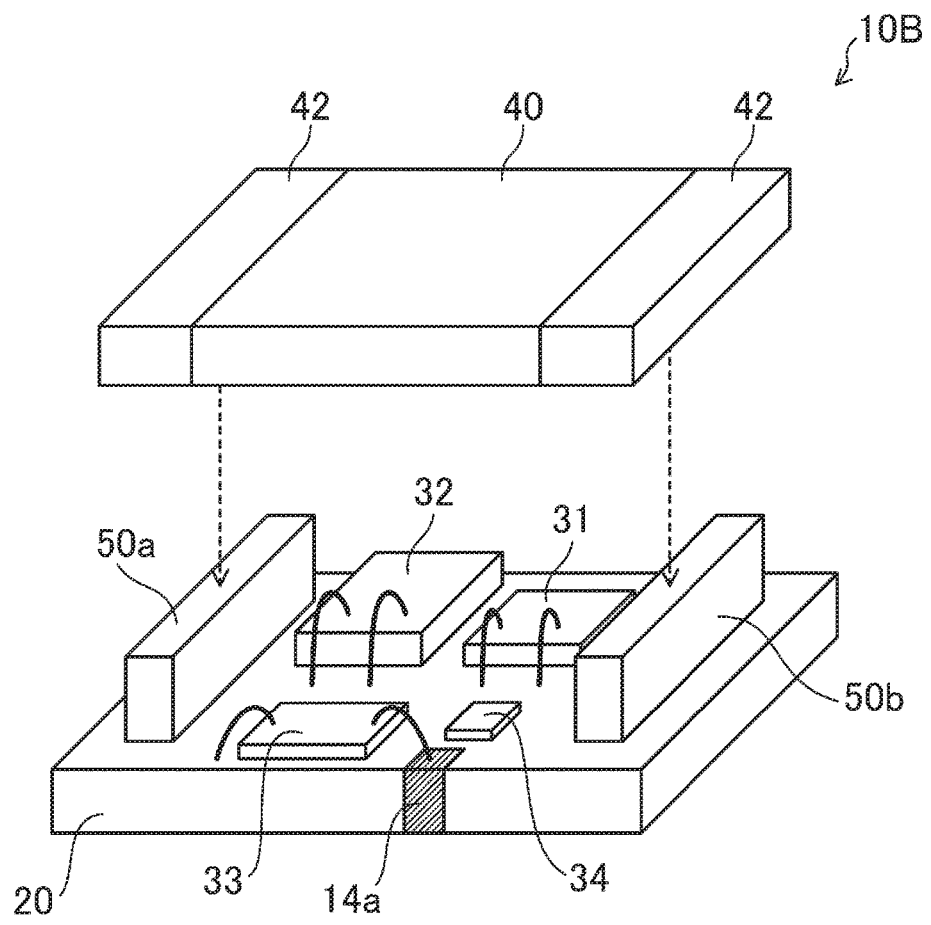
FIG. 1 is an exploded perspective view showing a basic structure example of a DC-DC converter module according to an embodiment.
Figure 3:
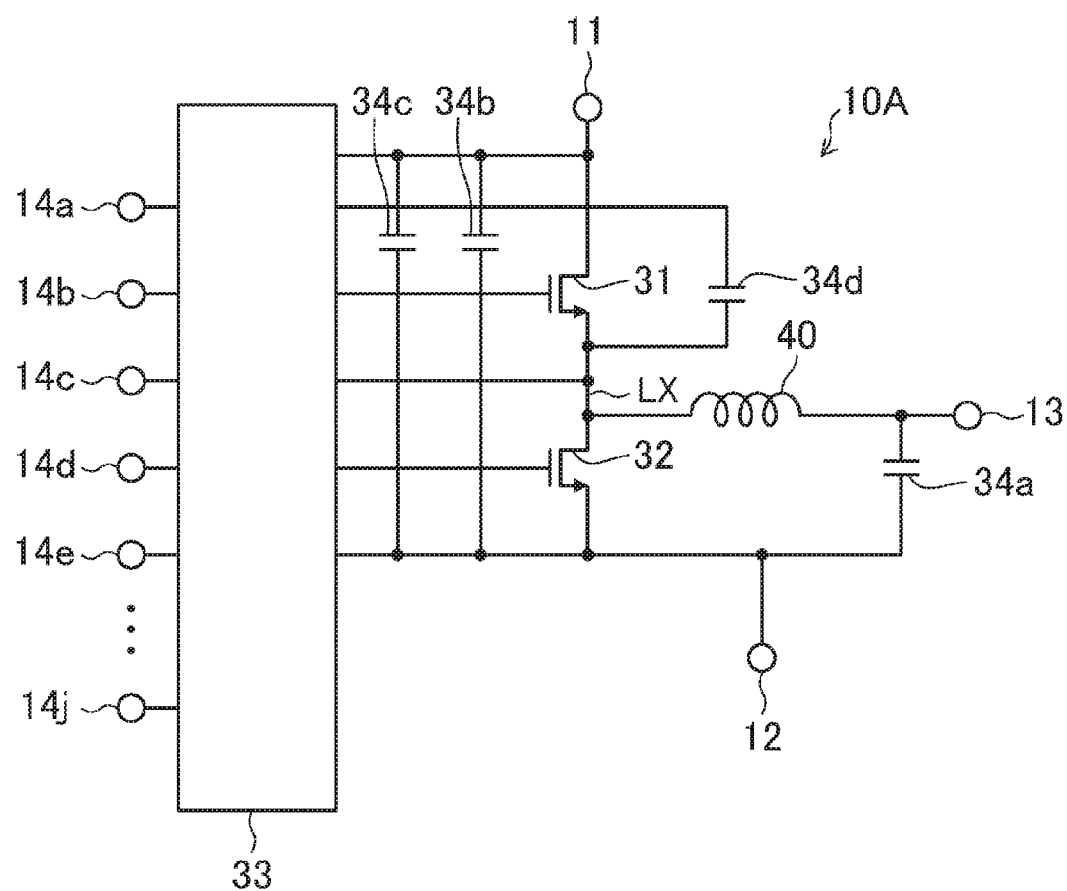
FIG. 3 is a conceptual diagram showing an example of a circuit configuration of the DC-DC converter according to an embodiment.
Figure 4A:
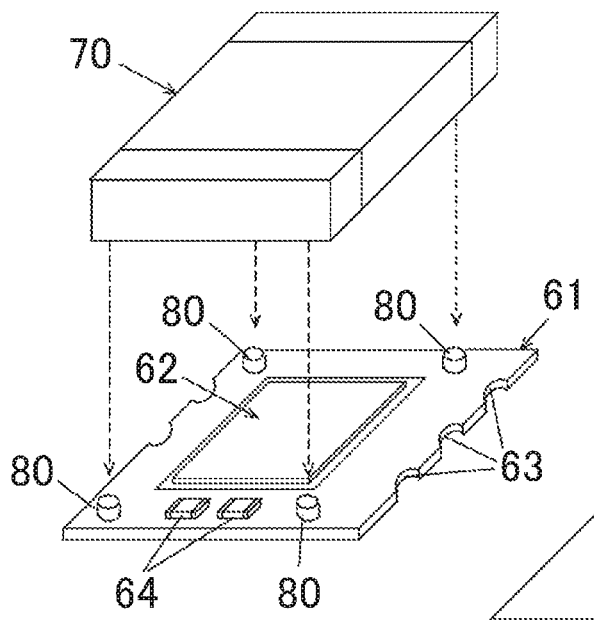
FIG. 4A is an exploded perspective view showing the basic structure of a DC-DC converter module of known art.
Figure 4B:
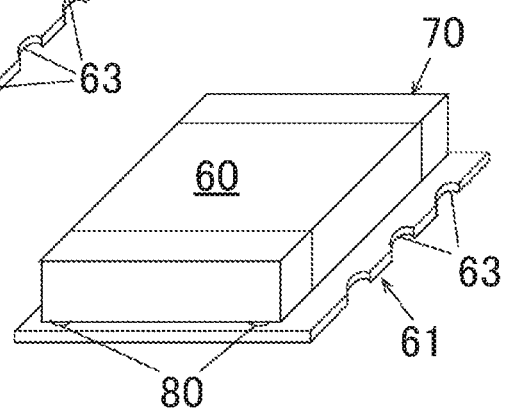
FIG. 4B shows the assembled and finished module.
Figure 5:
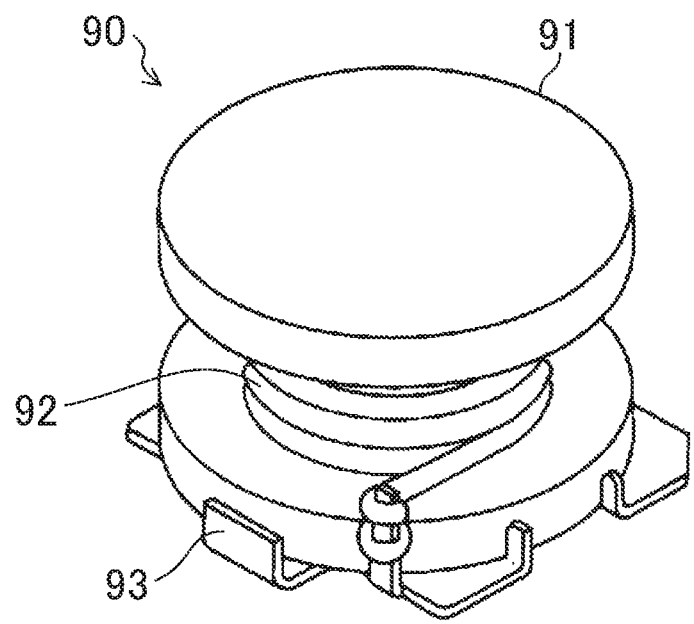
FIG. 5 is a perspective view showing the inside structure of an inductor of known art.

FIG. 1 is an exploded perspective view showing an example of a basic structure of the DC-DC converter module according to an embodiment. FIG. 2A is a conceptual diagram showing an example of a wiring pattern of the DC-DC converter module according to the embodiment. In this embodiment, the DC-DC converter is configured as a DC-DC buck converter. Note that the DC-DC converter is not limited to the DC-DC buck converter, and even if the DC-DC converter is configured as a DC-DC boost converter or a DC-DC buck-boost converter, the same or similar advantages are still provided. FIG. 3 is a conceptual diagram showing an example of a circuit configuration of the DC-DC buck converter according to the embodiment.

(Example of Circuit Configuration of Buck Converter)

The DC-DC converter 10A shown in FIG. 3 is called a buck converter (a DC-DC buck converter). This converter receives, at a power supply terminal 11, an input DC voltage Vi, converts it to an output DC voltage Vo that is lowered and stabilized, and then, outputs the output voltage Vo from an output terminal 13.

As shown in FIG. 3, the DC-DC converter 10A includes: a controller IC chip 33 serving as a control circuit; an inductor 40; a high-side switching transistor 31 and a low-side switching transistor 32 which are connected in series between the power supply terminal 11 and a ground terminal 12; input capacitors 34b and 34c; an output capacitor 34a connected between the output terminal 13 and the ground terminal 12; and a bootstrap capacitor 34d.

The high-side switching transistor 31 has a terminal connected or coupled to the power supply terminal 11, and the other terminal connected or coupled to a terminal of the low-side switching transistor 32 via a connection line LX. The high-side switching transistor 31 receives, at its gate, a control signal from the controller IC chip 33. The low-side switching transistor 32 has a terminal connected or coupled to the connection line LX, and the other terminal connected or coupled to the ground terminal 12. The low-side switching transistor 32 receives, at its gate, a control signal from the controller IC chip 33. A switching voltage is produced in the connection line LX.

The input capacitors 34b and 34c are connected in parallel between the power supply terminal 11 and the ground terminal 12. The input capacitors 34b and 34c are installed to reduce voltage fluctuation caused by an input current which is converted to a high-frequency square-wave current by the switching operation by the high-side switching transistor 31 and the low-side switching transistor 32.

The bootstrap capacitor 34d has an end (the positive terminal) connected or coupled to the controller IC chip 33 and the other end (the negative terminal) connected or coupled to the connection line LX. Specifically, the positive terminal of the bootstrap capacitor 34d is connected or coupled to the controller IC chip 33 via a rectifier element (not shown) such as a diode, and receives a drive voltage fed from the controller IC chip 33. The bootstrap capacitor 34d is charged when the low-side switching transistor 32 is on, and serves as a drive power source for the high-side switching transistor 31.

The inductor 40 has an end connected or coupled to the connection line LX and the other end connected or coupled to the output terminal 13.

The controller IC chip 33 has, for example, a detector (not shown) configured to detect an output current and an output voltage of the DC-DC converter 10A, a reference voltage generator (not shown) configured to generate a reference voltage, and an oscillation signal generator (not shown) configured to output an oscillation signal. The controller IC chip 33 receives control signals from control terminals 14a to 14j, and performs, for example, loop control of the switching operation of the high-side switching transistor 31 and the low-side switching transistor 32. In the controller IC chip 33, various protective functions and other functions are integrated. Specifically, the control terminal 14a is a feedback terminal to which the output DC voltage Vo that has been divided by a resistor is input, for example. The control terminal 14b is a remote terminal configured to perform control to activate or deactivate the DC-DC converter 10A, for example. The control terminal 14c is an overcurrent protection setting terminal, for example. The control terminal 14d is a soft start setting terminal configured to set a rising speed of output on startup, for example. The control terminal 14e is a power-good terminal configured to indicate proper operation, for example.

In FIG. 3, the input DC voltage Vi applied to the power supply terminal 11 is converted, by alternately turning on and off the high-side switching transistor 31 and the low-side switching transistor 32, to an AC voltage Vm ranging from several hundred kHz to several MHz. The converted AC voltage Vm is converted to a DC voltage, that is, the output DC voltage Vo by the inductor 40 and the output capacitor 34a, and then, output from the output terminal 13.

Here, a ratio of the on-time relative to one switching cycle of the high-side switching transistor 31 is represented by a time ratio S. The relation between the input DC voltage Vi and the output DC voltage Vo is written as follows:

$$Vo = \delta \times Vi \quad (1)$$

The controller IC chip 33 adjusts the time ratio δ and alternately activates the high-side switching transistor 31 and the low-side switching transistor 32 such that the output DC voltage Vo is stabilized.

(Arrangement of Terminals and Mounting of Components on Module Substrate)

A DC-DC converter module 10B includes the DC-DC converter 10A. In FIG. 1, the DC-DC converter module 10B has a module substrate 20 (a substrate). On a surface of the module substrate 20, surface-mounted electrodes and a circuit wiring pattern are formed, for example. Some of the surface-mounted electrodes and part of the circuit wiring pattern extend from the surface to a side of the module substrate 20. FIG. 1 shows, as a representative example of the terminals extending from the surface to a side of the module substrate 20, the control terminal 14a that is located on the side facing the viewer in the direction Y. Therefore, although not shown, other electrode terminals (surface-mounted electrodes) and the circuit wiring pattern also extend from the surface to a side of the module substrate 20. Note that all or some of the electrode terminals and circuit wiring pattern may extend only on the surface of the module substrate 20.

On the surface of the module substrate 20, stud terminals 50a and 50b facing each other are provided, as projection terminals (a pair of conductive terminals), in both end portions in the lateral direction on the paper (i.e., the direction X). In the direction Y on the paper, the stud terminals 50a and 50b are located at about the middle of the module substrate 20. The stud terminal 50a and 50b extend in the direction Y and project, from the surface of the module substrate 20, in the thickness direction of the substrate (i.e., in the direction Z, or the upward direction in FIG. 1).

An inductor 40 in a rectangular plate shape is mounted on, and attached to, the tops of the pair of stud terminals 50a and 50b such that the inductor 40 extends from one stud terminal 50a to the other stud terminal 50b. The inductor 40 has, in its both end portions in the direction X, conductive inductor terminals 42 and 42 having different polarities. The inductor terminals 42 and 42 having opposite polarities are positioned such that they are electrically connected respectively to the stud terminals 50a and 50b once the inductor 40 is attached to the pair of stud terminal 50a and 50b. The inductor 40 is attached to the tops of the pair of stud terminals 50a and 50b by soldering, for example. This attachment may be implemented by any method other than soldering, as long as the stud terminal 50a and 50b are electrically connected to the inductor 40.

In addition to the stud terminals 50a and 50b, the high-side switching transistor 31, the low-side switching transistor 32, and the controller IC chip 33 and a CR component 34 such as a capacitor or a resistor are mounted on the surface of the module substrate 20. As shown in FIG. 2A, the CR component 34 includes the output capacitor 34a, the input capacitors 34b and 34c, and the bootstrap capacitor 34d.

As shown in FIG. 2A, the power supply terminal 11, the ground terminal 12, and the output terminal 13 are formed, as surface-mounted electrodes, on the surface of the module substrate 20.

The output terminal 13 has a rectangular shape in a plan view, and is electrically and mechanically connected, on the substrate surface, to the stud terminal 50a. Specifically, the output terminal 13 extends from the upper left corner portion of the module substrate 20 along the upper edge in the lateral direction (i.e., the direction X) on the paper, and also along the left edge of the module substrate 20 in the direction Y. The stud terminal 50a is positioned at the middle of the output terminal 13 in the direction X, and in a lower portion of the output terminal 13 in the direction Y.

The ground terminal 12 has a rectangular shape in a plan view, and is arranged adjacent to, and on the right of, the output terminal 13. The ground terminal 12 is electrically and mechanically separated from the output terminal 13. Specifically, the ground terminal 12 extends along the upper edge of the module substrate 20 in the direction X, and parallel to the output terminal 13 in the direction Y. The ground terminal 12 has a shorter length in the direction Y than the output terminal 13.

The power supply terminal 11 has an L-shape in a plan view, and is arranged adjacent to, and on the right of, the ground terminal 12. The power supply terminal 11 is electrically and mechanically separated from the ground terminal 12. Specifically, the power supply terminal 11 extends along the upper edge of the module substrate 20 in the direction X to reach the right edge of the module substrate 20. The power supply terminal 11 also extends parallel to the ground terminal 12 in the direction Y. Further, the power supply terminal 11 is indented by the connection line LX that lies along the outer periphery of the stud terminal 50b. The power supply terminal 11 is electrically and mechanically separated from the connection line LX. The length of the long side in the direction Y of the power supply terminal 11 is longer than that of the ground terminal 12 and shorter than that of the output terminal 13.

The connection line LX serving as a node has a substantial U shape in a plan view, and is electrically and mechanically connected, on the substrate surface, to the stud terminal 50b. Specifically, the connection line LX extends along the right edge of the module substrate 20 in the direction Y, and toward the left of the paper in an intermediate portion of the module substrate 20 in the direction Y. The stud terminal 50b is mounted at the center, with respect to the directions X and Y, of the rectangular section of the connection line LX. The connection line LX has a section which extends from a lower portion of the left side of its rectangular section and which lies under the power supply terminal 11 and the ground terminal 12, in a plan view. The connection line LX, the power supply terminal 11, the ground terminal 12, and the output terminal 13 are electrically and mechanically separated from one another.

As can be seen from the foregoing, the DC-DC converter module 10B of the present disclosure has the terminal arrangement in which, in the direction toward the stud terminal 50a as one conductive terminal from the stud terminal 50b as the other conductive terminal (the leftward direction on the paper), the power supply terminal 11, the ground terminal 12, and the output terminal 13 are arranged in this order. This arrangement renders pattern design and external wiring easy, and makes it easy to arrange components such as the input capacitor and the output capacitor. Further, this arrangement allows for minimizing the wiring impedance, which results in increase in the efficiency and reduction of noise.

The high-side switching transistor 31 and the low-side switching transistor 32 are mounted between the stud terminals 50a and 50b. Specifically, the high-side switching transistor 31 is mounted, by soldering, on the surface of a section of the power supply terminal 11 which is located between the stud terminals 50a and 50b. In this manner, a terminal of the high-side switching transistor 31 is electrically connected to the power supply terminal 11. The other terminal of the high-side switching transistor 31 is connected or coupled to the connection line LX by wire bonding. The low-side switching transistor 32 is mounted, by soldering, on the surface of a section of the connection line LX which is located between the stud terminals 50a and 50b and positioned closer to the stud terminal 50a (under the ground terminal 12 on the paper). In this manner, a terminal of the low-side switching transistor 32 is electrically connected to the connection line LX. The other terminal of the low-side switching transistor 32 is connected or coupled to the ground terminal 12 by wire bonding. Note that the method of connecting each component to the associated terminal or the wiring pattern is not limited to soldering or wire bonding, and they may be electrically and mechanically connected to each other by other methods. This is also applicable to the following description.

On the substrate surface, a connection line P1 extends under the connection line LX, on the paper. The controller IC chip 33 is mounted on the surface of this connection line P1. The controller IC chip 33 is mounted such that its upper edge is positioned below the virtual line L1 which connects the lower edges of the stud terminals 50a and 50b, on the paper. The controller IC chip 33 is connected, by wire bonding, to the gates of the high-side switching transistor 31 and the low-side switching transistor 32. Further, the controller IC chip 33 is connected or coupled to the control terminals 14a to 14j by wire bonding.

The controller IC chip 33 not only drives the high-side switching transistor 31 and the low-side switching transistor 32, but also includes therein a control circuit that operates in response to a small signal and that performs the loop control of the feedback signal from the output terminal 13 and various protective functions. Therefore, if the controller IC chip 33 were arranged close to a magnetic component such as the inductor 40, the possibility of the occurrence of malfunction in the controller IC chip 33 due to leakage flux could increase.

In the present disclosure, in a plan view, the high-side switching transistor 31 and the low-side switching transistor 32 are arranged within an area AR1 where the inductor 40 and the module substrate 20 overlap each other, whereas the controller IC chip 33 is arranged outside the area AR1. In other words, switching transistors (e.g., the high-side switching transistor 31 and the low-side switching transistor 32) which operate in response to a large signal are arranged immediately under the inductor 40 that produces a large amount of leakage flux (e.g., within the area AR1 where the inductor 40 overlaps the module substrate 20), and the controller IC chip 33 (the control circuit) is arranged in a region surrounding the area AR1 (e.g., outside the area AR1). This arrangement reduces the influence exerted by the leakage flux from the inductor on the control circuit that operates in response to a small signal, thereby allows for ensuring stable operation of the DC-DC converter module (the DC-DC converter).

In this embodiment, the controller IC chip 33 is arranged outside the area AR1. However, the entire control circuit does not necessarily have to be arranged outside the area AR1. As described above, it is suitable that portions of the control circuit which may malfunction due to the influence of leakage flux are arranged outside the area AR1. In general, the control circuit of the DC-DC converter includes a detector and a generator. The detector receives detection signals indicative of an output voltage and/or an output current from the DC-DC converter and a detection signal indicative of an operating voltage and/or an operating current of the DC-DC converter, for example. The generator includes a reference voltage generator configured to generate and output a reference signal for comparison with the detection signals, and an oscillation signal generator configured to generate and output an oscillation signal. These detector and generator operate in response to a small signal and make the control circuit perform the control operation. It is therefore preferable to arrange these detector and generator outside the area AR1.

The connection line P1 has lower right and lower left corner portions which extend respectively to the lower right and lower left corner portions of the module substrate 20. On the paper, a connection line P2 which is electrically and mechanically separated from the other terminals extends under the output terminal 13. The connection line P2 is connected or coupled to the controller IC chip 33 by wire bonding.

The surface-mounted electrodes and the circuit wiring pattern on the module substrate 20 are lead frames, for example. The lead frames have, in addition to the power supply terminal 11, the ground terminal 12, and the output terminal 13, the control terminals 14a to 14j which are configured to enable the functions of the controller IC chip 33 to be externally set. The control terminals 14a to 14j are arranged along the lower edge of the module substrate 20 in the direction X. The control terminals 14a to 14j and the connection line P1 are electrically and mechanically separated from one another.

On the paper, the output capacitor 34a is positioned, in the direction Y, above the upper end of the stud terminal 50a that is mounted in an upper left portion of the module substrate 20. The output capacitor 34a has an end connected or coupled to the ground terminal 12 and the other end connected or coupled to the output terminal 13.

On the paper, the bootstrap capacitor 34d is mounted below the lower edge of the stud terminal 50b, in the direction Y. The bootstrap capacitor 34d has its negative terminal connected or coupled to a connection line P3 and its positive terminal connected or coupled to a connection line P4. The connection line P3 is electrically and mechanically separated, on the substrate surface, from the other terminals, but connected or coupled to the high-side switching transistor 31 by wire bonding. Likewise, the connection line P4 is electrically and mechanically separated, on the substrate surface, from the other terminals, but connected or coupled to the controller IC chip 33 by wire bonding.

As can be seen from the foregoing, the DC-DC converter module 10B of the present disclosure has the wiring pattern in which the high-side switching transistor 31 is arranged closer to the stud terminal 50b than the low-side switching transistor 32 is. This wiring pattern enables the negative terminal of the bootstrap capacitor 34d to be directly connected to the source of the high-side switching transistor 31 via a power supply line (i.e., the wire bonding), without using the connection line LX.

Consequently, the drive loop for turning on the high-side switching transistor 31 has no common impedance with a large current loop of the switching current, and therefore, a sufficient drive voltage is ensured. Further, the influence that the switching current of the switching transistors exerts on the drive loop is reduced. This allows for preventing the losses caused by an increase in the on resistance of the high-side switching transistor 31 from increasing. Here, the drive loop refers to a loop connecting the positive electrode of the bootstrap capacitor 34d, the controller IC chip 33, the gate of the high-side switching transistor 31, the source of the high-side switching transistor 31, and the negative electrode of the bootstrap capacitor 34d together, in this order. The large current loop refers to a current loop passing from the source of the high-side switching transistor 31 to the inductor 40 through the connection line LX.

Further, according to the present disclosure, the parasitic inductance of the power supply line for the switching transistor (the high-side switching transistor 31) is reduced, which allows for increasing efficiency.

On the paper, the input capacitors 34b and 34c are aligned in the direction Y and above the middle in the direction X, on the module substrate 20. Each of the input capacitors 34b and 34c has an end connected or coupled to the power supply terminal 11, and the other end connected or coupled to the ground terminal 12. Specifically, the input capacitor 34c is mounted within the area AR1 and close to the upper end of the area AR1, and the input capacitor 34b is mounted outside the area AR1 and aligned with the input capacitor 34c.

Here, a capacitor having a large capacitance is used as the input capacitor 34b, whereas a capacitor having a low equivalent series resistance (ESR) is used as the input capacitor 34c. In this manner, the input capacitor 34b having a large capacitance reduces the fluctuation in the power supply voltage caused by the switching current passing through the high-side switching transistor 31. At the same time, the input capacitor 34c having a low ESR absorbs the superposition of surge voltage due to sharp fluctuation in current caused when the high-side switching transistor 31 is turned on or off.

This configuration in which the input capacitors 34b and 34c having different characteristics such as the capacitance and the ESR are connected in parallel between the power supply terminal 11 and the ground terminal 12 allows for minimizing the loop of high-frequency ripple current which passes through the capacitors. Further, this configuration allows for enhancing the function as bypass capacitors, along with the reduction of ESR and the increase in capacitance of the capacitors. The number of the input capacitors 34b, 34c that are connected in parallel and have different characteristics is not limited to two, and three or more capacitors may be provided. The positions of the input capacitors 34b and 34c may be reversed in the direction Y. In a plan view, both the input capacitors 34b and 34c may be mounted within or outside the area AR1.

(Comparison with Case where Components are Mounted Exactly According to Circuit Configuration)

FIG. 2B is a conceptual diagram showing an example of a wiring pattern of a DC-DC converter module 10C where the components are mounted exactly according to the circuit configuration of FIG. 3.

As shown in FIG. 2B, the DC-DC converter module 10C where the components are mounted exactly according to the circuit configuration of FIG. 3 has the terminal arrangement in which the ground terminal 12, the power supply terminal 11, and the output terminal 13 are arranged in this order in the direction from the stud terminal 50b toward the stud terminal 50a (in the leftward direction on the paper). This terminal arrangement makes it difficult to connect the output capacitor 34a between the ground terminal 12 and the output terminal 13. This terminal arrangement also makes it difficult to design a pattern (not shown) and to arrange components (not shown) outside the DC-DC converter module 10C.

In the DC-DC converter module 10C shown in FIG. 2B, the high-side switching transistor 31 is positioned farther from the stud terminal 50b than the low-side switching transistor 32 is. It is accordingly difficult to connect one end (the connection line) of the bootstrap capacitor 34d to the high-side switching transistor 31 by wire bonding in the same manner as in FIG. 2A. Therefore, in the DC-DC converter module 10C, the connection line connected or coupled to one end of the bootstrap capacitor 34d is directly connected to the connection line LX.

As a result, in the wiring pattern shown in FIG. 2B, the drive loop has a common impedance with the large current loop. Specifically, in FIG. 2B, the drive loop connects the positive terminal of the bootstrap capacitor 34d, the controller IC chip 33, the gate of the high-side switching transistor 31, the source of the high-side switching transistor 31, the connection line LX, and the negative terminal of the bootstrap capacitor 34d together, in this order. The large current loop is a current loop passing from the source of the high-side switching transistor 31 to the inductor 40 through the connection line LX, in the same manner as in FIG. 2A.

Consequently, in particular, an induced voltage caused by a switching current flowing to the parasitic inductance of the connection line LX lowers the drive voltage applied between the gate and source of the high-side switching transistor 31. This causes an increase in the losses due to an increase in the on resistance of the high-side switching transistor 31.

Other Embodiments

The above embodiment has been described as an example of the technique of the present disclosure. However, the technique of the present disclosure is not limited to the above embodiment, and is applicable to other embodiments to which modification, substitution, addition, omission, etc., are made as appropriate. Such embodiments will be described below, as examples.

In the above embodiment, the DC-DC converter module includes the buck converter to which a high-frequency switching current is input, and therefore, two or more input capacitors 34b and 34c of different types are connected in parallel. The present disclosure is not limited to this configuration. For example, if the DC-DC converter is a boost converter, the output capacitors may be configured as two or more capacitor of different types which are connected in parallel. If the DC-DC converter is a buck-boost converter such as an inverting converter, the input capacitors may be configured as two or more capacitors of different types which are connected in parallel, and the output capacitors may be configured as two or more capacitors of different types which are connected in parallel.

In FIG. 2A, the controller IC chip 33 is arranged outside the area AR1. However, this is a merely an example. For instance, a portion of the controller IC chip 33 may be within the area AR1. On the surface of the module substrate 20, the influence that the leakage flux from the inductor 40 exerts on a point decreases as the point comes closer to the peripheral edge of the inductor 40. Therefore, also in the case where a portion of the controller IC chip 33 is within the area AR1, the controller IC chip 33 is subjected to a reduced influence of the leakage flux. It is however preferable to arrange the controller IC chip 33 outside the area AR1 in order to reduce further the influence of the leakage flux.

As described above, the DC-DC converter module of the present disclosure is useful for power supply circuits which supply a DC voltage to various electronic devices, and in particular, for DC-DC converter modules for use as a POL power supply.

What is claimed is:

1. A DC-DC converter module in which a DC-DC converter having a switching transistor and a control circuit controlling the switching transistor is provided, the DC-DC converter module comprising:
a substrate having a surface on which the switching transistor and the control circuit are mounted;
a projection terminal projecting from the surface of the substrate; and
an inductor attached to the projection terminal so as to face the surface of the substrate, and electrically connected to the substrate through the projection terminal, wherein
in a plan view, the switching transistor is arranged in an area where the inductor overlaps the substrate, whereas at least a portion of the control circuit is arranged outside the area,
the substrate has a power supply terminal to which an input DC voltage is applied, an output terminal from which an output DC voltage is output, and a ground terminal to which a common reference voltage for the input DC voltage and the output DC voltage is applied,
the switching transistor comprises a high-side switching transistor having a terminal connected to the power supply terminal, and a low-side switching transistor connected between the high-side switching transistor and the ground terminal,
one conductive terminal of the projection terminal is electrically connected to the output terminal, and the other conductive terminal of the projection terminal is electrically connected to a node between the high-side switching transistor and the low-side switching transistor, on the substrate, the power supply terminal, the ground terminal, and the output terminal are arranged in this order in a direction from the conductive terminal connected to the node to the conductive terminal connected to the output terminal, the projection terminal comprises a pair of conductive terminals which are each electrically connected to an associated one of two terminals of the inductor, the switching transistor is arranged between the pair of conductive terminals, the DC-DC converter is a buck converter, and the high-side switching transistor is arranged closer to the other conductive terminal than the low-side switching transistor is.

2. The DC-DC converter module of claim 1, further comprising:

a bootstrap capacitor mounted on the substrate and serving as a drive power source for the high-side switching transistor, wherein a conductive line to which a negative terminal of the bootstrap capacitor is connected is separated from a conductive line to which the conductive terminal connected to the node is connected, and is electrically connected to an output terminal of the high-side switching transistor by an electrical connection line.

3. The DC-DC converter module of claim 1, wherein, a plurality of capacitors having different characteristics are connected in parallel between the power supply terminal or a power supply conductive line connected to the power supply terminal and the ground terminal or a ground conductive line connected to the ground terminal.

4. The DC-DC converter module of claim 1, wherein, the DC-DC converter is configured as a DC-DC boost converter.

5. The DC-DC converter module of claim 1, wherein, the DC-DC converter is configured as a DC-DC buck-boost converter.

6. The DC-DC converter module of claim 1, wherein, the control circuit has a detector which detects at least one of an output current, an operating current, an output voltage, or an operating voltage of the DC-DC converter, a reference voltage generator which generates and outputs a reference voltage, and an oscillation signal generator which outputs an oscillation signal, and at least one of the detector, the reference voltage generator, or the oscillation signal generator is arranged outside the area.

* * * * *